(12) United States Patent
Felps

(10) Patent No.: US 7,898,219 B2
(45) Date of Patent: Mar. 1, 2011

(54) ON-BOARD BATTERY SUPERVISOR

(75) Inventor: Jimmie Doyle Felps, Colorado Springs, CO (US)

(73) Assignee: Jimmie Doyle Felps, Colorado Springs, CO (US)

( * ) Notice: Subject to any disclaimer, the term of this patent is extended or adjusted under 35 U.S.C. 154(b) by 531 days.

(21) Appl. No.: 12/072,195

(22) Filed: Feb. 25, 2008

(65) Prior Publication Data
US 2009/0212740 A1    Aug. 27, 2009

(51) Int. Cl.
H02J 7/00    (2006.01)
(52) U.S. Cl. .................................. 320/134; 324/430
(58) Field of Classification Search ................ 320/134; 324/430; 417/411, 425
See application file for complete search history.

(56) References Cited

U.S. PATENT DOCUMENTS

| | | | |
|---|---|---|---|
| 3,395,288 A | 7/1968 | Von Brimer | |
| 3,646,354 A | 2/1972 | Von Brimer | |
| 4,039,903 A | 8/1977 | Russell | |
| 4,080,560 A | 3/1978 | Abert | |
| 4,493,001 A | 1/1985 | Sheldrake | |
| 4,902,956 A | 2/1990 | Sloan | |
| 5,089,762 A | 2/1992 | Sloan | |
| 5,136,230 A | 8/1992 | Gayler | |
| 5,140,250 A | 8/1992 | Morland | |
| 5,200,877 A | 4/1993 | Betton et al. | |
| 5,272,380 A | 12/1993 | Clokie | |
| 5,321,389 A | 6/1994 | Meister | |
| 5,550,445 A * | 8/1996 | Nii | 318/153 |
| 5,656,919 A * | 8/1997 | Proctor et al. | 320/153 |
| 5,698,955 A | 12/1997 | Nii | 318/139 |
| 5,717,310 A * | 2/1998 | Sakai et al. | 307/10.1 |
| 5,804,947 A * | 9/1998 | Nii et al. | 322/16 |
| 6,037,749 A | 3/2000 | Parsonage | |
| 6,198,254 B1 * | 3/2001 | Satake et al. | 320/132 |
| 6,242,891 B1 | 6/2001 | Parsonage | |
| 6,424,158 B2 * | 7/2002 | Klang | 324/433 |
| 7,525,285 B2 * | 4/2009 | Plett | 320/132 |
| 7,768,266 B2 * | 8/2010 | Yamaguchi | 324/430 |
| 2004/0119441 A1 * | 6/2004 | Koo | 320/104 |
| 2004/0140139 A1 * | 7/2004 | Malik | 180/65.2 |
| 2004/0178798 A1 * | 9/2004 | Kikuchi et al. | 324/426 |
| 2005/0212487 A1 * | 9/2005 | Sodeno | 320/132 |
| 2005/0264296 A1 * | 12/2005 | Philbrook | 324/433 |
| 2005/0285445 A1 * | 12/2005 | Wruck et al. | 307/10.1 |
| 2008/0094069 A1 * | 4/2008 | Huang | 324/430 |
| 2008/0112817 A1 * | 5/2008 | Sylvester | 417/44.11 |
| 2008/0169819 A1 * | 7/2008 | Ishii | 324/430 |
| 2008/0177444 A1 * | 7/2008 | Tachibana et al. | 701/41 |
| 2008/0224709 A1 * | 9/2008 | Tae et al. | 324/430 |

(Continued)

*Primary Examiner*—Edward Tso
*Assistant Examiner*—Arun Williams

(57) ABSTRACT

An on-board battery supervisor that monitors the state-of-charge (SOC) of a lead-acid vehicle battery and automatically disconnects loads from the battery to prevent over-discharging of the battery, is disclosed. As the battery is being discharged, the on-board battery supervisor disconnects loads at an SOC level that leaves enough energy in the battery to reliably start the vehicle engine, while providing as much energy as possible to accessory loads. The loads are automatically reconnected as the battery is charged. Some preferred embodiments of the invention are designed specifically for use in watercraft and a dual output version of the invention simplifies the electrical system. All embodiments have circuit breaker outputs, high peak current capability, a low quiescent current drain and a dual timer that allows accurate determination of the SOC of the battery.

16 Claims, 10 Drawing Sheets

U.S. PATENT DOCUMENTS

| | | | |
|---|---|---|---|
| 2008/0224718 A1* | 9/2008 | Melichar et al. | 324/693 |
| 2009/0017643 A1* | 1/2009 | Oakes | 439/34 |
| 2009/0051364 A1* | 2/2009 | Ishida et al. | 324/430 |
| 2009/0096399 A1* | 4/2009 | Chen et al. | 318/441 |
| 2009/0103341 A1* | 4/2009 | Lee et al. | 363/124 |
| 2009/0302681 A1* | 12/2009 | Yamada et al. | 307/46 |
| 2009/0319108 A1* | 12/2009 | Kawai | 701/22 |

* cited by examiner

ON-BOARD BATTERY SUPERVISOR

FIELD OF THE INVENTION

This invention relates generally to motor vehicle electrical systems, and more specifically, to an on-board battery supervisor that monitors the state-of-charge (SOC) of the battery and at a low SOC level, disconnects the battery from all or most accessory loads, except the vehicle engine. This low SOC level is chosen to be high enough to ensure the vehicle engine can be started, yet safely delivering as much energy as possible to various accessory loads.

BACKGROUND OF THE INVENTION

Since the introduction of lead-acid batteries and electric starting motors to motor vehicles, other electrical loads in the motor vehicle have been able to discharge the battery to a level at which it can no longer start the vehicle engine. Various alarms (e.g. a buzzer that goes off when lights are left on and the driver's door is opened) have been added to warn the operator when these electrical loads are on and might over-discharge the battery. These alarms are critical for the headlights of motor vehicles because headlights are normally on a separate circuit, for safety reasons. The general object of the present invention is to prevent over-discharging of the vehicle battery, by various accessory loads, to this critical level.

In marine applications, a battery can be used to start the outboard motor (or other engine type) as well as providing power for such loads as a trolling motor and other accessories. As a general rule these loads have battery power applied to them at all times, even when the outboard motor is not running. A trolling motor can draw as much as 50 A of current. When the outboard motor is not running, any of these loads can discharge the battery to a state-of-charge (SOC) level that makes starting the engine difficult or impossible. This can be a nuisance when a fisherman (i.e. operator) is on an inland lake, and can be life threatening when the operator is on coastal waters, in a remote area of an inland lake or during extreme weather conditions.

Over-discharging a battery to the point where the boat engine can not be started is so prevalent in marine applications that few fishermen run the risk of sharing one battery for engine "starting" and for accessories. Therefore, a typical fishing boat has one battery for starting the engine and powering accessories and another battery (or batteries) for powering the trolling motor. Then, at least a 2-bank charger is required to maintain the batteries. Although somewhat less likely to occur, this still leaves the operator exposed to over-discharging the engine battery by the remaining accessories connected to it. A disadvantage of this solution is that it adds the additional weight and cost of an extra battery and a more complex charger. Another disadvantage is that the trolling motor battery(s) does not get charged when the boat engine is running, unless a specialized charger is also added to the electrical system.

Many in-vehicle attempts have been made to monitor the SOC of a vehicle battery and switch some or all of the battery loads off at an SOC level that allows effective starting of the vehicle engine. Examples are Von Brimer (U.S. Pat. Nos. 3,395,288 and 3,646,354), Russell (U.S. Pat. No. 4,039,903), Abert (U.S. Pat. No. 4,080,560), Sheldrake (U.S. Pat. No. 4,493,001), Sloan (U.S. Pat. Nos. 4,902,956 and 5,089,762), Gayler (U.S. Pat. No. 5,136,230), Morland (U.S. Pat. No. 5,140,250), Betton et al. (U.S. Pat. No. 5,200,877), Clokie (U.S. Pat. No. 5,272,380), Meister (U.S. Pat. No. 5,321,389) and Parsonage (U.S. Pat. Nos. 6,037,749 and 6,242,891 B1).

Prior solutions have not been practical solutions because of their complexity, lack of overload protection, lack of reverse battery protection, excessive quiescent current consumption and/or inability to accurately determine the SOC of the vehicle battery. None of these prior solutions address the marine environment and, more specifically, the unique case of having a high current accessory load such as an electric trolling motor that is always operated when the boat engine is not running.

There are many factors that make it difficult to determine the SOC of a vehicle battery. First, battery voltage and battery current must be monitored at all times for all load conditions. Battery current must be monitored because a lead-acid battery has a significant internal resistance that causes the battery voltage to decrease with increasing load current. This internal resistance increases as the level of the SOC of the battery decreases. I measured a 23 m$\Omega$ internal resistance at a 40 A load current and approximately 20% SOC on a deep-cycle battery with a marine cranking amp (MCA) rating of 875 A. Another deep-cycle battery with an MCA rating of 840 A, measured a slightly higher internal resistance and a starting battery with a MCA rating of 1000 A, measured slightly lower. Therefore, the MCA or the cranking amp (CA) rating on a battery is inversely proportional to, yet an indirect measure of a battery's internal resistance. The internal resistance of a battery is non-linear with respect to load current. Internal resistance of the 875 A MCA rated battery (mentioned above) measured an internal resistance of 26 m$\Omega$ at 20 A decreasing to 21 m$\Omega$ at 80 A. At lower currents the internal resistance increased more rapidly, 30 m$\Omega$ at 10 A, 36 m$\Omega$ at 5 A, 40 m$\Omega$ at 2.5 A and 65 m$\Omega$ at 1.25 A. The error in sensed battery voltage caused by this changing internal resistance is typically <0.12V (or <5% SOC). Second, a lead-acid battery's voltage recovery from having its load switched between two levels is very "sluggish," due to internal, chemical reactions. My own observation of several lead-acid batteries and several lead-acid battery types (e.g. starting, deep-cycle, different MCA ratings, etc.) has shown that they all exhibit this "sluggish" characteristic. When the load is suddenly increased on a battery, it can take 30 seconds or more for the internal resistance of the battery to decrease to within 10% of its final value. Also, when the load is suddenly decreased on a battery from a high current (say 60 A) to no load (0 A), it can take 10 minutes or more for the battery voltage to increase to within 0.1V of its final value. But, when the load is switched from a high current (say 60 A) to a low current (say 2.5 A), the time required to settle is typically reduced to <60 seconds. Recovery time is also typically <60 seconds when the battery load is switched from a low current (say 2.5 A) to no load (0 A). Therefore, timers are required to make an accurate determination of a battery's SOC. These same timers can prevent "cranking" current, to the vehicle engine, from causing a false detection of low SOC of the battery. Third, a lead-acid battery's energy storage capacity decreases with decreasing temperature. Other desirable features that a battery supervisor should incorporate are: minimum operator intervention, minimum interconnection to vehicle electrical wiring, low quiescent current, over-current protection, high surge current capability, over-temperature protection, ESD protection and sometimes, more than one switch.

As a lead-acid battery is discharged, it forms lead sulfate on the positive plates. If the battery is left in a discharged (or partially discharged) state for an extended period of time (even as little as 12 hours) the lead sulfate will begin to harden (i.e. crystallize). When this happens, the battery loses capacity and its internal resistance increases. Therefore, especially in marine applications, an on-board marine battery charger needs to be a part of the electrical system.

A switch (or switches) used to connect to and disconnect from vehicle loads must be able to deliver high surge currents. For example, an incandescent lamp can draw as much as 14 times its rated current at turn on. In practice, the surge current is typically <7 times the rated current, because of wiring resistance. e.g. a spotlight can draw a surge current of 37 A when it is first turned on, but draw only 5.9 A when it has been on for a while. The time constant of the surge current is typically <10 mS. Electric motors also draw high surge currents. Typical surge current for a trolling motor can be as much as 8 times its rated current, but seldom exceeds 65 A. The time constant of the surge current of a motor is typically <100 mS. A DC to AC inverter's surge current can be >100 A (and may only be limited by wiring resistance) with a typical time constant of <5 mS. Any of these surges can be experienced even when a DC load already exists on the battery. Therefore, the switch (or switches) must have a high surge current capability, even at high DC load currents.

SUMMARY OF THE INVENTION

In a preferred embodiment, the invention automatically switches battery loads off and on based on the state-of-charge (SOC) of the battery, with emphasis placed on marine applications. In the determination of the SOC, battery voltage and current are continuously measured while compensation is continuously applied, for the internal resistance of the battery. Once the invention determines a satisfactory SOC level (typically 30%) of the battery exists, the output switch is turned on and a dual timer keeps the switch on for a period of time based on the output current of the invention. e.g. the switch is on longer when the load current is below a pre-determined level, approximately 2.5 A. The compensation for battery internal resistance is based on, and indirectly proportional to, the marine cranking amp (MCA) or cranking amp (CA) rating of the 12V, lead-acid battery being used. Therefore, different versions of the invention would be manufactured for use with batteries of different MCA (or CA) rating ranges, typically ±10%. When the invention switches off (typically 20% SOC level), sufficient energy is left in the battery for starting the vehicle engine (including watercraft engines), while providing a low quiescent current drain. The switch is also a latching circuit breaker. An SPST toggle switch can be used to manually switch the load off and on. In marine applications, the invention allows the operator to confidently use the same battery for starting the boat engine (typically an outboard motor) and for running an electric trolling motor. An embodiment of the invention includes status and control circuitry (for indication and control), monitor and timer circuitry (for determining the SOC of the battery), power circuitry (with an overload protected output circuit breaker/switch) and current conditioning circuitry (for setting the output circuit breaker/switch trip current level and providing battery internal resistance compensation). In another preferred embodiment, the invention has an additional output switch in the power circuitry to drive accessories other that the trolling motor. In another preferred embodiment, the invention uses an ignition switch for control.

The invention has numerous advantages, a few of which are delineated below, merely as examples.

An advantage of the invention is that it is a practical, "stand-alone" solution for preventing over-discharging of the battery used for "cranking" the outboard motor (or other vehicle engine type).

Another advantage of the invention is that in marine applications it allows the operator to confidently use one battery for starting the outboard motor and for running the electric trolling motor.

Another advantage of the invention is that its output switch(s) automatically turns back on when the vehicle engine runs for approximately a minute. This occurs with no operator intervention.

Another advantage of the invention is that it utilizes a dual timer to achieve a more accurate measure of the SOC of the battery, 1-minute and 10-minute.

Another advantage of the invention is that each output switch is also a circuit breaker.

Another advantage of the invention is that one embodiment of the invention has two circuit breaker/switch outputs, one for a trolling motor and another for other accessories.

Another advantage of the invention is that one embodiment of the invention is a single-output version that uses the ignition switch for control, which makes the invention virtually transparent to the user. i.e. the only operator intervention required is for the operator to start the vehicle engine when accessory power is automatically switched off or for the operator to cycle the ignition switch off and back on when the output circuit breaker has been tripped.

Another advantage of the invention is that it has a low quiescent current drain when in the on state (typically 12 mA for single output and 18 mA for dual output).

Another advantage of the invention is that it can be manually switched to the off state where it has a very low quiescent current drain (<1 mA for all versions).

Another advantage of the invention is that it can have the battery connections reversed, without damage.

Another advantage of the invention is that it can serve as a high current, disconnect switch(s) (using the OFF/RESET-ON switch) to manually disconnect battery loads for long term storage.

Another advantage of the invention is that it has temperature compensation for reduced battery capacity at cold temperatures.

Another advantage of the invention is that it has high peak current handling capability (typically 300 A for the single output version and typically 200 A for the accessory output of the dual output version).

Another advantage of the invention is that the status indicators can be seen in bright sunlight.

BRIEF DESCRIPTION OF THE DRAWINGS

The invention can be better understood with reference to the following drawings. The components in the drawings are not necessarily to scale or adhere to conventional symbols, emphasis being placed upon clearly illustrating the principles of the present invention. Moreover, in the drawings, like reference numerals (or alphanumeric designators) designate corresponding parts throughout the several views and in which.

DETAILED DESCRIPTION OF THE INVENTION

Figure 1:
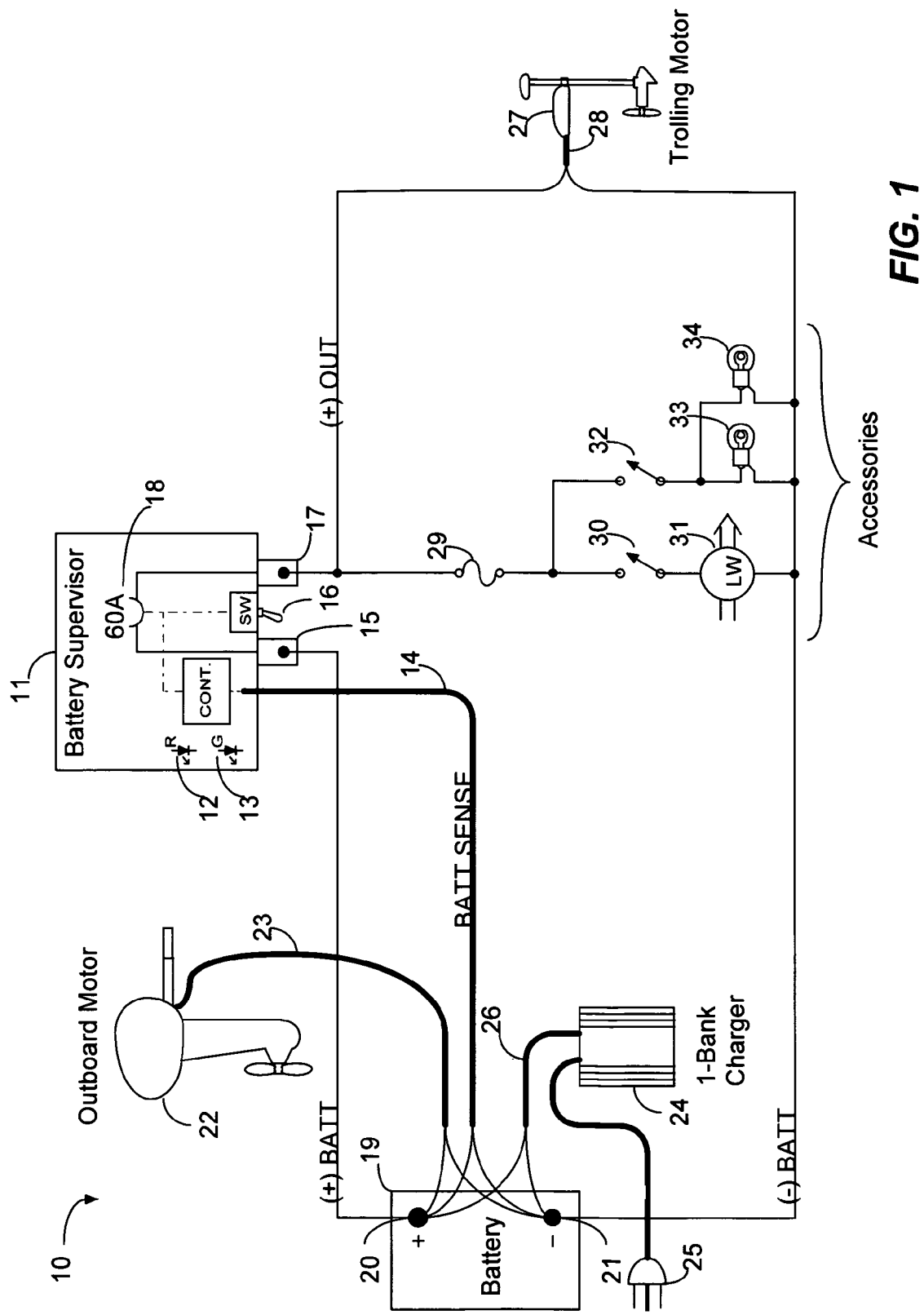
FIG. 1 is a simplified block diagram illustrating a boat's electrical system (including a trolling motor and a minimum of accessory loads) in which a single-output version of the on-board battery supervisor of the present invention reside.

FIG. 1 illustrates a typical boat (or other watercraft) electrical system 10 that includes the waterproof, single-output, on-board, battery supervisor 11 in accordance with the present invention. Battery supervisor 11 is a "stand-alone" assembly whose heat sink is used for mounting. The "hardwired" BATT SENSE cable 14 makes a Kelvin connection to battery 19 (i.e. power connections are made separately). Bus bars 15 and 17 serve as the high current input and output, respectively. OFF/RESET-ON switch 16 is easily accessible to the operator. Status LEDs 12 and 13 are easily visible to the operator (even in bright sunlight).

Battery 19 is typically a 12V, deep-cycle or dual-purpose (also deep-cycle), lead-acid battery with a marine cranking amp (MCA) rating of at least 100 ampere-hours (AH). The three, 2-wire cables 14, 23 and 26 typically have ring-tongue crimp terminals for attaching to the appropriate positive terminal 20 and negative terminal 21 of battery 19 (typically red wire to positive and black wire to negative). Deep-cycle and dual-purpose batteries typically have terminals of two types for each polarity, posts and threaded studs with wing nuts. It is best to connect BATT SENSE cable 14 to the terminal posts since some batteries (even name brand) have a significant resistance (i.e. a few mΩ) between the post and the stud. The best battery terminal configuration is where the stud comes up out of the middle of the post. Then the resistance between the post and stud terminals is insignificant.

Outboard motor 22 uses battery 19 for "cranking" and when outboard motor 22 is running, it charges battery 19. Charger 24 is a 1-bank, on-board, marine charger for charging battery 19 when the boat is docked (or stored) and power cord 25 is plugged into an AC outlet. Trolling motor 27 gets its power (positive connection) from output bus bar 17 of battery supervisor 11 through one wire of a 2-wire cable 28, with the other wire (negative connection) connected to negative battery terminal 21. Accessories such as live-well pump 31 and running lights 33 and 34 get their power through their respective switches 30 and 32 through a shared fuse (or circuit breaker) 29. These accessories are typical for a small fishing boat. Trolling motor manufacturers normally recommend a 60 A circuit breaker for their trolling motors even though a trolling motor's maximum current rating is typically 50 A or less. Therefore, there is sufficient current for accessories 31, 33 and 34.

FIG. 1 represents one embodiment of the present invention. In operation, the voltage and current monitor circuit (shown as CONT. in battery supervisor 11) opens the 60 A circuit breaker/switch 18 in battery supervisor 11 when the state-of-charge (SOC) of battery 19 has decreased to a pre-determined level (approximately 20% SOC). This SOC level is chosen to be high enough to be able to reliably start outboard motor 22 while still providing as much energy as possible to power trolling motor 27 and accessories 31, 33 and 34. Charge is put back into battery 19 when outboard motor 22 is running. When outboard motor 22 is running and battery 19 reaches an SOC level of approximately 30%, the 60 A, circuit breaker/switch 18 in battery supervisor 11 automatically turns back on. This generally occurs in about 1 minute because the SOC of battery 19 is increasing and because the charging current through the internal resistance of battery 19 is causing an increase in sensed voltage. The 60 A, circuit breaker/switch 18 in battery supervisor 11 has a high surge current rating (typically 300 A) and has a fast trip action (typically <250 uS) when the output is shorted. Therefore, automotive, blade-type fuses of 5 A or more in series with battery supervisor 11 output circuit breaker/switch 18 will not normally "blow" when a short circuit occurs. In the event the 60 A, circuit breaker/switch 18 in battery supervisor 11 is "tripped," the operator can reset the circuit breaker/switch by switching the OFF/RESET-ON switch 16 to the OFF/RESET position and back to the ON position. Battery supervisor 11 has a typical quiescent operating current of 12 mA. If power from the battery monitor 11 is not needed and a low quiescent current (<1 mA) is desired, the operator can place OFF/RESET-ON switch 16 in the OFF/RESET position. Battery supervisor 11 can also be used as a high current switch (controlled by OFF/RESET-ON switch 16) for manually connecting and disconnecting battery loads. When battery supervisor 11 detects a sufficient SOC level of battery 19, green LED 13 is on. When battery supervisor 11 detects a fault, red LED 12 is also on. If battery connections to battery supervisor 11 are reversed during installation, only the red LED 12 will be on.

Figure 2:
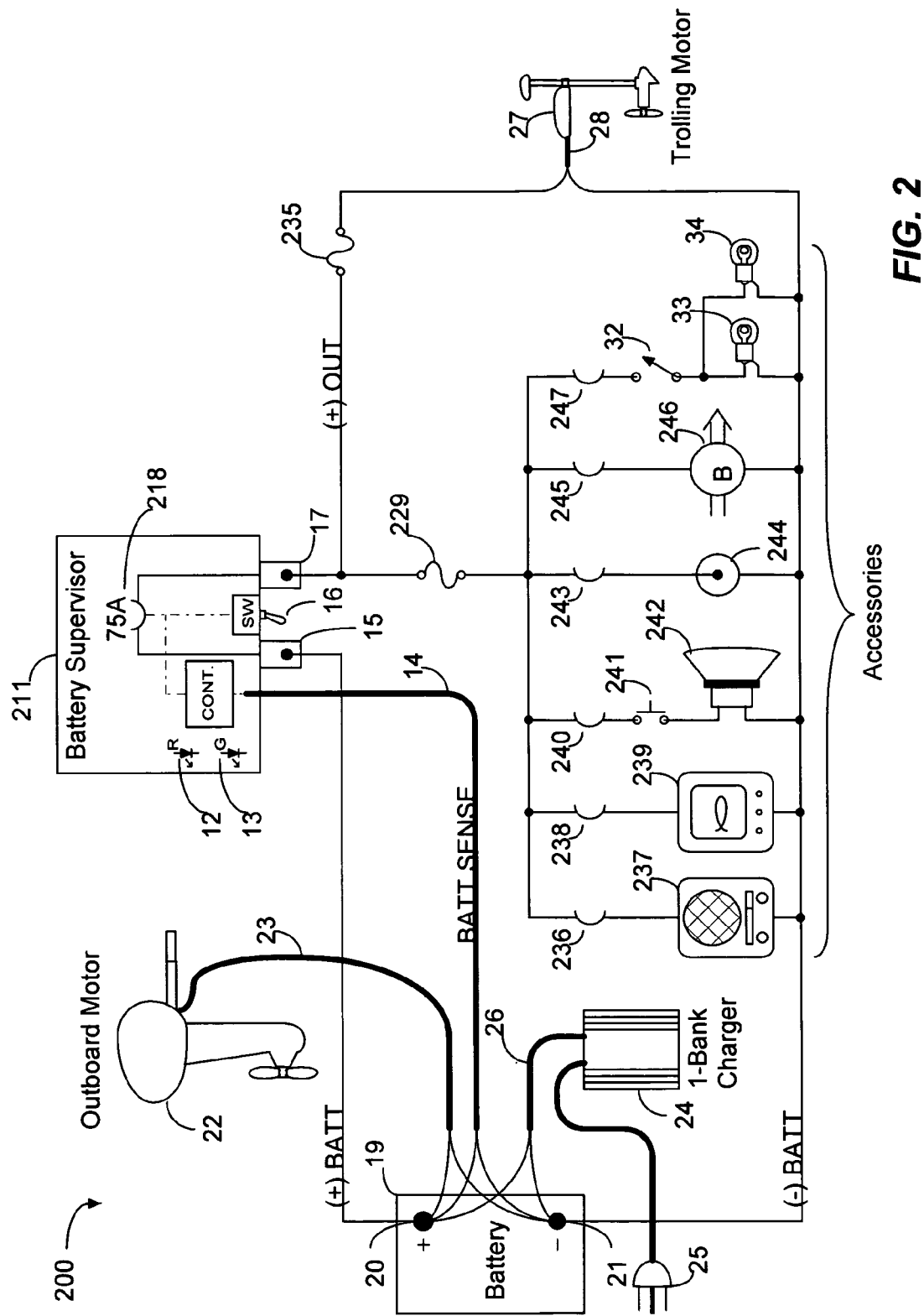
FIG. 2 is a simplified block diagram illustrating a boat's electrical system (including a trolling motor and many accessory loads) in which a single-output version of the on-board battery supervisor of the present invention reside.

FIG. 2 illustrates a typical boat (or other watercraft) electrical system 200 that includes a waterproof, single-output, on-board battery supervisor 211 with a 75 A circuit breaker/switch 218 in accordance with the present invention. FIG. 2 shows additional accessories over those found in FIG. 1, that would be representative of a larger boat. Current for insignificant loads (such as a clock or the station memory of a radio) is not shown and is not sensed.

FIG. 2 represents another embodiment of the present invention where the circuit breaker/switch 218 in battery supervisor 211 is rated at 75 A instead of the 60 A rating in battery supervisor 11 in FIG. 1. Fuse 229 would typically have a larger rating than fuse 29 in FIG. 1, and is required to protect accessory circuit breaker wiring. Fuse (or circuit breaker) 235 is required to protect trolling motor 27. Typical accessories include radio 237, fish finder 239, horn 242, 12V power connector 244 (for additional accessories such as a spotlight or DC-to-AC inverter for AC loads), automatic, water level sensing, bilge pump 246 and running lights 33 and 34. Except for running lights 33 and 34 that share circuit breaker (or fuse) 247, each of these accessories get their power through their respective circuit breakers (or fuses) 236, 238, 240, 243 and 245. Typically, fuses 229 and 235 would be automotive blade-type fuses in waterproof holders. Operation of the electrical system in FIG. 2 is the same as in FIG. 1.

One skilled in the art can see that battery supervisor 211 can also be used when there is no trolling motor 27. e.g. battery supervisor 211 with a circuit breaker/switch 218 rating (of say 30 A) could be used to protect a bass boat's engine battery from being over-discharged by its accessory loads.

Figure 3:
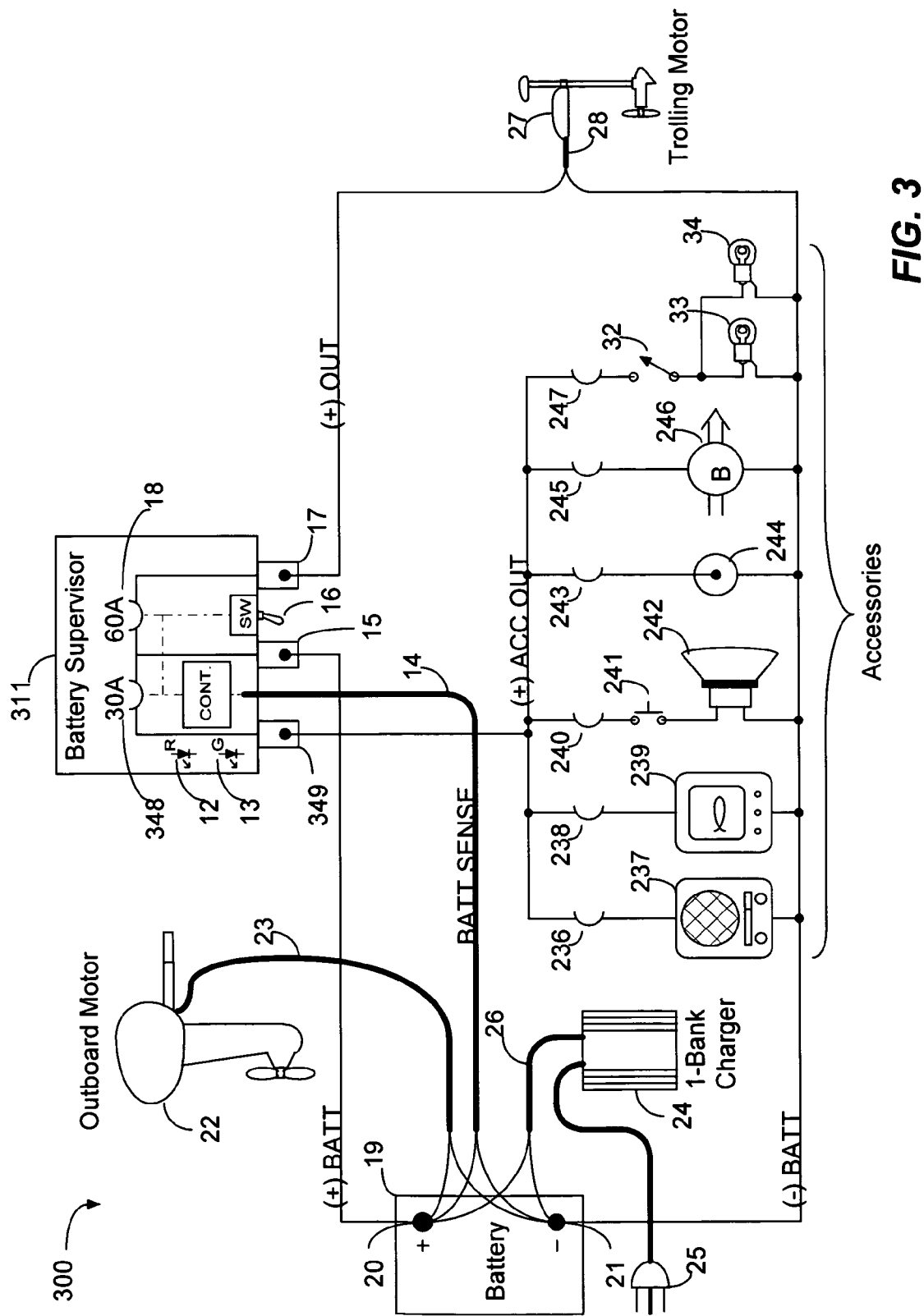
FIG. 3 is a simplified block diagram illustrating a boat's electrical system (including a trolling motor and many accessory loads) in which a dual-output version of the on-board battery supervisor of the present invention reside.

FIG. 3 illustrates a typical boat (or other watercraft) electrical system 300 that includes a waterproof, dual-output, on-board battery supervisor 311 in accordance with the present invention. Dual-output battery supervisor 311, having two circuit breaker/switches 18 and 348, eliminates the need for fuses 229 and 235 in FIG. 2.

FIG. 3 represents another embodiment of the present invention where battery supervisor 311 is a dual output version of battery supervisor 11 in FIG. 1. The accessory output circuit breaker/switch 348 (with its output on bus bar 349 of battery supervisor 311) provides accessory power for loads other than the trolling motor 27. The 30 A, circuit breaker/switch 348 output has a typical surge current rating of 200 A. Operation of the electrical system in FIG. 3 is the same as in FIG. 1, with the following exceptions. Both circuit breaker/switches 18 and 348 switch off and on at the same time and are controlled together.

Figure 4A:
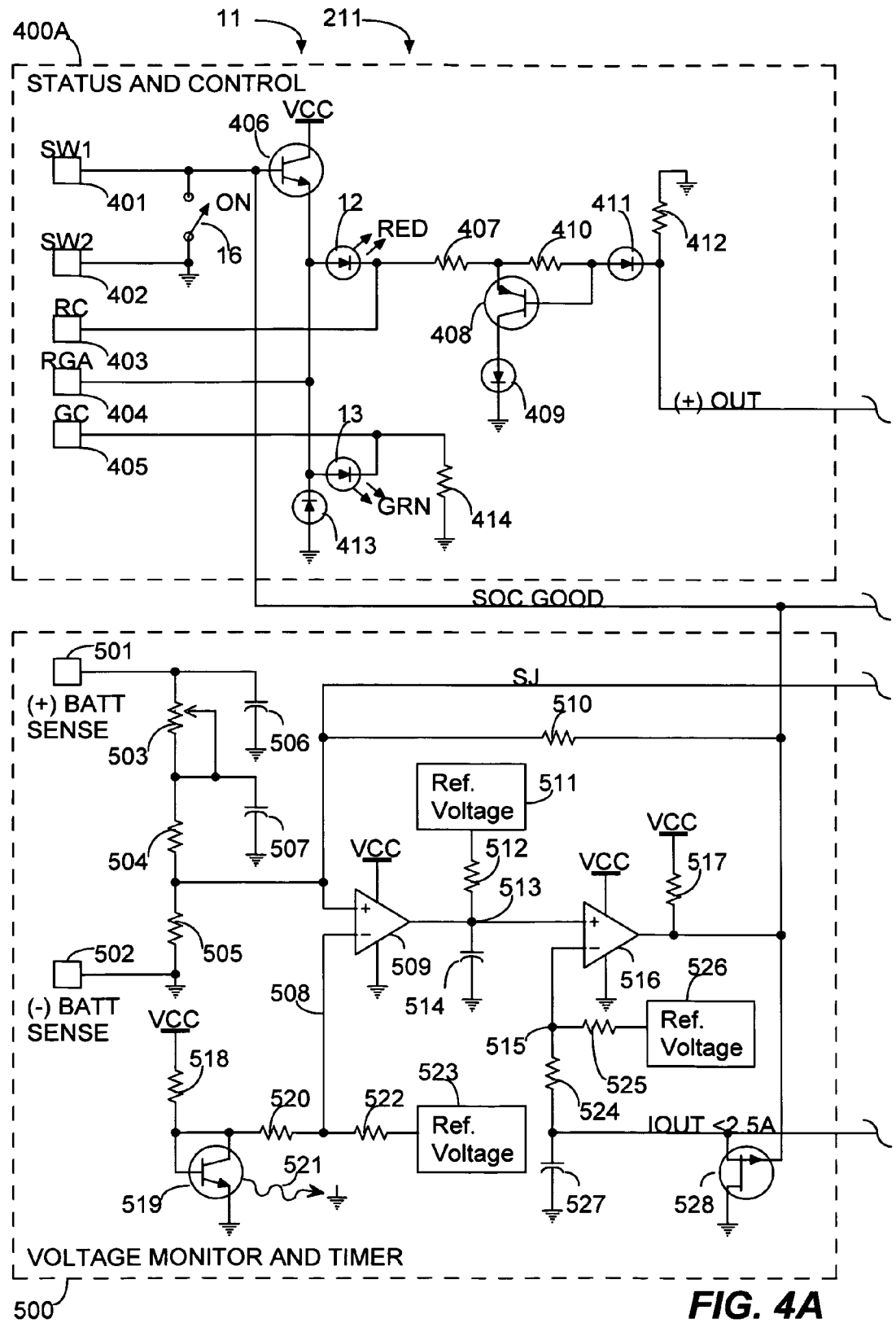
FIGS. 4A and 4B combine to form a schematic diagram of a single-output version of the on-board battery supervisor of FIGS. 1 and 2 in accordance with the present invention.
Figure 4B:
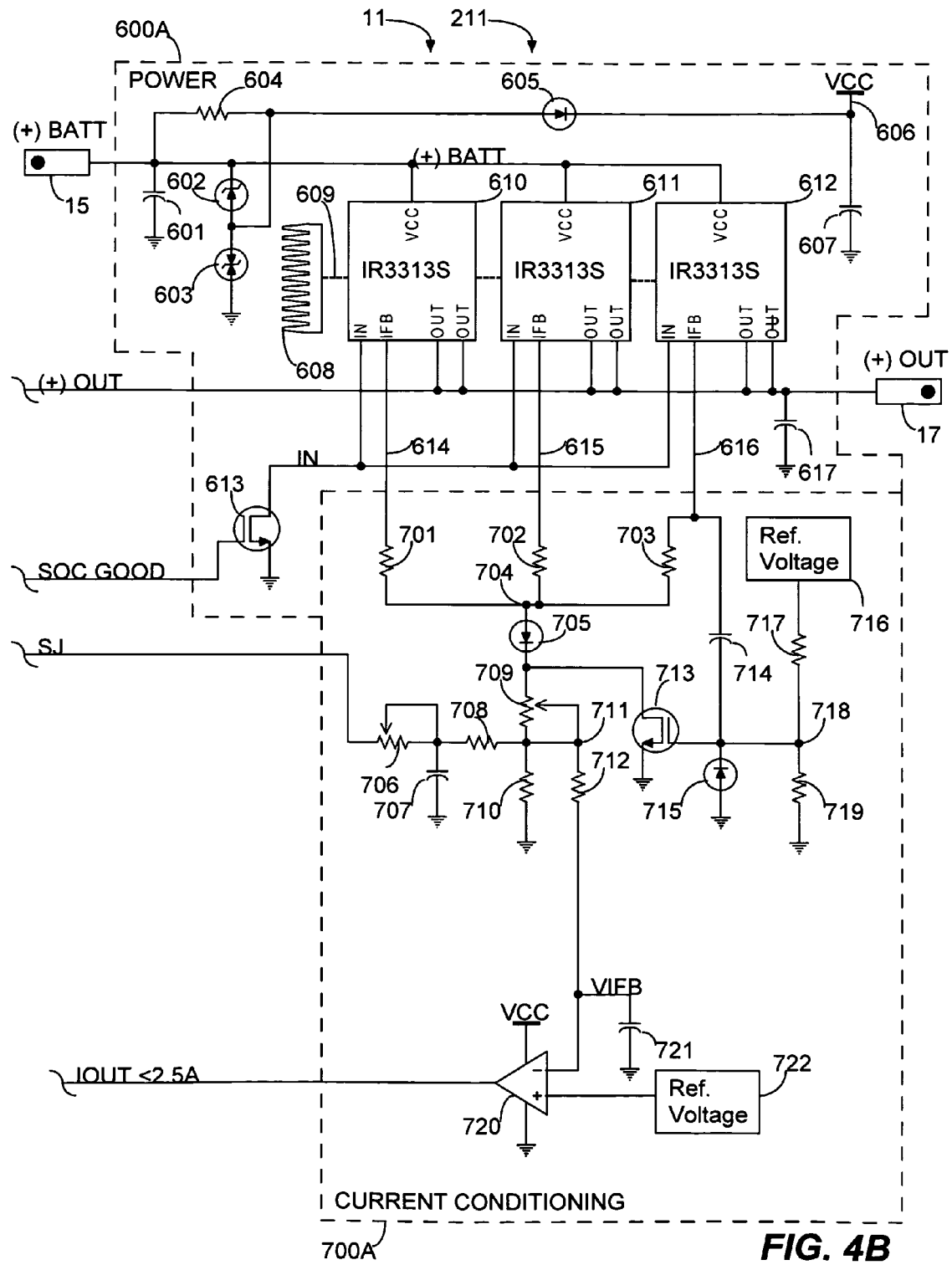

FIGS. 4A and 4B combine to form a schematic diagram of the circuitry contained in battery supervisor 11 in FIG. 1 and 211 in FIG. 2. FIGS. 4A and 4B are an embodiment of a single-output version of the present invention. For this discussion also refer to FIGS. 1 and 2. Battery supervisor 211, in FIG. 2 differs from battery supervisor 11, in FIG. 1, in that it has a 75 A current rating for circuit breaker/switch 218. Variable resistor 709 in CURRENT CONDITIONING box 700A, in FIG. 4B, has a different setting to provide the 75 A rating. STATUS AND CONTROL box 400A, in FIG. 4A, displays the status and provides control of battery supervisor 11 and 211. NPN transistor 406 is an emitter follower that buffers the status loads, LEDs 12 and 13, from signal SOC GOOD, whose origin is in VOLTAGE MONITOR AND TIMER box 500, in FIG. 4A. Green LED 13 is on when a satisfactory SOC level exists in battery 19 and red LED 12 can also be on when high side switches 610, 611 and 612 in POWER box 600A, in FIG. 4B, are off. When battery 19 is reversed, only the red LED 12 will be on. SPST OFF/RESET-ON switch 16 turns high side switches 610, 611 and 612 off in the OFF/RESET position (i.e. contact closed) and resets their internal latches, if they are set. OFF/RESET-ON switch 16 turns high side switches 610, 611 and 612 on when in the ON position (i.e. contact open), if a satisfactory SOC level exists in battery 19. Resistor 407 (4.02 kΩ) sets the operating current in ultra high efficiency, red LED 12 to approximately 2 mA. PNP transistor 408 and diode 409 provide a current path to ground for red LED 12. Resistor 410 (33.2 kΩ) holds transistor 408 off when there is no fault. Diode 411 prevents reverse current from flowing through red LED 12. Diode 409 prevents current from flowing through the collector-base junction of transistor 408 when battery 19 is reversed. Pull-down resistor 412 (33.2 kΩ) is required because of the leakage current of the high side switches 610, 611 and 612 in the off state. e.g. resistor 412 allows red LED 12 to stay on if the operator momentarily shorts (+) OUT to ground, but no load exists. Diode 413, resistor 407, base-emitter junction of transistor 408 and diode 411 provide a current path for red LED 12 when battery 19 is reversed. Resistor 414 (4.02 kΩ) sets the operating current for ultra high efficiency, green LED 13 to approximately 2 mA. Battery supervisors 11 and 211 are potted for waterproofing. LEDs 12 and 13 are left exposed for viewing and the toggle handle on OFF/RESET-ON switch 16 is left unpotted. If a remote status and control is desired, a "hard-wired" cable would connect to solder pads 401 through 405, with a remote SPST switch and remote red and green LEDs attached to the appropriate connections at the end of the "hard-wired" cable. OFF/RESET-ON switch 16, red LED 12 and green LED 13 would not be loaded on the printed circuit board (PCB). The reason for pre-wiring the remote status and control option at the factory is to minimize the likelihood of ESD damage and to allow effective potting of battery supervisors 11 and 211.

VOLTAGE MONITOR AND TIMER box 500 monitors battery 19 voltage, (+) BATT SENSE to (−) BATT SENSE between solder pads 501 and 502. "Hard-wired" 2-wire BATT SENSE cable 14 connects to appropriate polarity solder pads 501 and 502. The ground reference for all circuitry in battery supervisors 11 and 211 is (−) BATT SENSE solder pad 502. This sensed voltage is summed with a voltage from variable resistor 706 in CURRENT CONDITIONING box 700A, in FIG. 4B, that is a function of the output current at (+) OUT bus bar 17. Comparator 509 compares the resultant voltage to a temperature compensated reference voltage at node 508 to determine the SOC of battery 19. Final determination of SOC is made after a timeout period, determined by dual timer comparator 516. Once the signal SOC GOOD (the output of comparator 516) goes high, it will not go low again until the dual timer has timed out. Capacitor 506 (0.1 uF) provides ESD protection for the voltage divider comprised of resistors 503 (120 kΩ typical setting), 504 (100 kΩ) and 505 (12.1 kΩ). Variable resistor 503 provides adjustment of the threshold voltage of comparator 509. Capacitor 507 (0.1 uF) provides voltage filtering of the battery sensed voltage. The negative going threshold voltage (relative to unloaded battery 19 sensed voltage) is 11.92V at 77 degrees F., which corresponds to an SOC level of approximately 20%. There are two voltage references that combine to form the reference voltage at node 508 for comparator 509. They are reference voltage 523 (+600 mV) which has a low temperature-coefficient (TC) of voltage verses temperature and another reference voltage (also approximately +600 mV) consisting of a diode-connected, NPN transistor 519, but having a negative TC of voltage verses temperature (approximately −1.17 mV/degree F.). Resistor 518 (56.2 kΩ) provides the bias current for transistor 519. Transistor 519 is thermally connected to the ground plane (shown symbolically by thermal arrow 521) which in turn is connected to heat sink 608 in POWER box 600A, in FIG. 4B. A low temperature rise of heat sink 608 allows transistor 519 to sense ambient temperature. A lead-acid battery loses approximately 17% of its energy capacity at 32 degrees F. compared to its energy capacity at 77 degrees. Therefore, a 24% SOC level (approximately 12.03V at no load at 32 degrees F.) is approximately the same energy in battery 19 as a 20% SOC level (approximately 11.92V at no load at 77 degrees F.). Therefore the reference voltage at node 508 needs to increase approximately 5.5 mV at 32 degrees F. (requiring a TC of voltage versus temperature of −122 uV/degree F.). Reference voltages 519 and 523 are connected together through resistors 520 and 522. The negative TC of voltage versus temperature of the reference at node 508 can be increased by making the resistance of resistor 520 smaller and/or the resistance of resistor 522 larger, and vise versa. Resistive divider resistors 520 (76.8 kΩ) and 522 (8.87 kΩ Thevenin equivalent resistance) provide the required voltage reference. Resistor 510 (20 MegΩ) provides external hysteresis (combined with internal hysteresis in comparator 509) for comparator 509 to prevent battery supervisor 11 and 211 from switching back on before the SOC of battery 19 has increased approximately 10% (or to approximately 240 mV total hysteresis, referred to the voltage at battery 19). The open drain output of comparator 509 is used in conjunction with reference voltage 511 (+2.25V), resistor 512 (3.48 MegΩ) and capacitor 514 (2 each 100 uF ceramic capacitors in parallel) to form a "re-triggerable" resistor-capacitor RC time constant at node 513. Comparator 516 compares capacitor 514 voltage, at node 513, to a switched reference voltage at node 515, yielding two selectable timers. The open-drain, output signal SOC GOOD of comparator 516 is pulled up to VCC (typically 11.9V with a charged battery 19) through resistor 517 (33.2 kΩ). When SOC GOOD goes high, green LED 13 is on, MOSFET 613 in POWER box 600A, in FIG.

4B, is on and circuit breaker/switches 610, 611 and 612 are on (unless their internal latches are set). Reference voltage 526 (+1.3V) provides the high-level reference for comparator 516 through resistor 525 (57.8 kΩ Thevenin equivalent resistance) when there is no current through voltage divider resistors 525 and 524 (9.53 kΩ). The open-drain output, IOUT <2.5 A, of comparator 720 in CURRENT CONDITIONING box 700A, in FIG. 4B, switches the reference voltage at node 515 between the high-level (+1.3V) and the low level (+184 mV) references. Internal hysteresis in comparator 516 causes the low level, positive going, threshold voltage to be +187 mV, typically. The high-level reference voltage (+1.3V) and the 10-minute timer are selected when output IOUT <2.5 A is high. The low-level reference voltage (+184 mV) and the 1-minute timer are selected when output IOUT <2.5 A is low. If a low SOC level of battery 19 is detected when the 1-minute timer is selected, P-channel FET 528 latches the timer in the 1-minute state. This is to prevent output SOC GOOD from going high again as output IOUT <2.5 A goes high because circuit breaker/switches 610, 611 and 612 have been turned off. Capacitor 527 (0.1 uF) holds output IOUT <2.5 A low, long enough for FET 528 to turn on.

Power circuitry 600A, in FIG. 4B, utilizes three, intelligent, high side switches 610, 611 and 612 in parallel to provide sufficient output current, a high peak output current, a feedback current proportional to (+) OUT current, over-voltage protection, over-current protection, over-temperature protection and reverse battery protection. Battery 19 current comes in on (+) BATT bus bar 15, goes through high side switches 610, 611 and 612 and goes out on (+) OUT bus bar 17. High side switches 610, 611 and 612 are turned off and on by N-channel MOSFET 613, being on when signal IN is low and off when signal IN is high. The body diode in MOSFET 613 conducts during reverse battery, which also turns switches 610, 611 and 612 on, with load current passing through them in a reverse direction. Heat sink 608 provides cooling for high side switches 610, 611 and 612 through the printed circuit board (PCB) and a thermal pad. This thermal/mechanical link is shown via dashed line 609. Capacitors 601 (0.47 uF) and 617 (0.1 uF) provide ESD protection and transient voltage filtering. Voltage transient suppressors 602 (8V unipolar) and 603 (14V bipolar) provide transient voltage protection for both positive and negative transient voltages, with a larger positive voltage transient being allowed. Resistor 604 (301Ω) provides current through diode 605 to VCC 606 (typically 11.9V) to the support circuitry in boxes 400A, 500 and 700A. Diode 605 prevents VCC 606 from being a negative voltage. Capacitor 607 (1 uF) provides voltage filtering for VCC 606. Feedback current IFB from each of the high side switches 610, 611 and 612 at nodes 614, 615 and 616, respectively, is sent to CURRENT CONDITIONING box 700A.

CURRENT CONDITIONING box 700A, in FIG. 4B, monitors and sums the feedback current IFB from each of the circuit breaker/switches 610, 611 and 612 at node 704. Resistors 701 (316Ω), 702 (316Ω) and 703 (316Ω) force current sharing of circuit breaker/switches 610, 611 and 612 and indirectly determine the amount of surge current that is delivered to (+) OUT at bus bar 17. Diode 705 blocks current during reverse battery. Current sense resistor 710 (205Ω) converts the sum of the IFB currents to a voltage, at node 711, proportional to (+) OUT current. The typical ratio (referred to as current ratio) of output load current at (+) OUT to total feedback current, IFB (total) at node 704, is 8800, but can be from 7500 to 9950 (approximately a 30% range, with a mid-range current ratio of 8725). Measuring the voltage at node 711 when a known load current exists at (+) OUT allows computation of the actual current ratio. Variable resistor 709 sets the current at which the circuit breaker/switches 610, 611 and 612 trip. The circuit breaker/switches 610, 611 and 612 will hold at the rated current and are set to trip at 110% of the rated current. They will always trip at 120% of their rated current. e.g. a 60 A circuit breaker will hold at 60 A, but always trip before the current reaches 72 A. The latching mechanism for the circuit breaker function in circuit breaker/switches 610, 611 and 612 is set by the voltage between signal IN and each of the current feedback outputs, IFB, at nodes 614, 615 and 616 (typically +4.7V at IFB referred to IN). When an over-current condition exists at (+) OUT, one of the latches in circuit breaker/switches 610, 611 or 612 will be set first, which will immediately turn that circuit breaker/switch off. The two circuit breaker/switches that remain on will immediately have to share the additional current that had been flowing through the circuit breaker/switch that is now off. That will cause a "domino" effect and all circuit breaker/switches will rapidly turn off (typically <250 uS for a short circuit). The circuit breaker/switch rating for battery supervisor 11 can be set to any rating from 25 A to 75 A. Component values shown are for a 60 A rating and a 66 A trip rating. Resistor 709 (237Ω typical setting) can be adjusted for a circuit breaker/switch rating up to 75 A, provided resistor 709 can be increased to 1.05 kΩ. Resistors 708 (33.2 kΩ) and 706 (190 kΩ typical setting for a 23 mΩ internal resistance of battery 19) provide feedback to summing junction SJ to compensate for the internal resistance of battery 19. Variable resistor 706 provides adjustment of this compensation feedback for the actual current ratio (typically 8800) of this set of high side switches 610, 611 and 612 and the internal resistance (23 mΩ typical) of battery 19. Capacitor 707 (0.1 uF) provides voltage filtering of the feedback voltage. Battery supervisors 11 and 211 have to be manufactured (i.e. adjusted) to match a specific battery 19 with a battery marine cranking amp (MCA) or cranking amp (CA) rating range of approximately ±10%. e.g. a battery with an 875 MCA rating would work with a battery supervisor 11 or 211 with an MCA/CA rating specification range of 788 to 962. As battery 19 ages and its internal resistance increases, battery supervisor 11 or 211 will switch off at an increasing SOC level, when load current exists. A battery 19 with excessive internal resistance will cause battery supervisor 11 or 211 to switch off at an SOC level that is >20% and can cycle back on after the dual timer times out (because the load has been removed). The rate at which this occurs, increases as battery 19 internal resistance increases. The cycling will stop when the SOC level of battery 19 reaches approximately 20% (the no load setting). Resistor 712 (41.2 kΩ) and capacitor 721 (0.1 uF) filter the voltage VIFB for comparator 720 negative input. Reference voltage 722 (+61 mV) is the reference for the positive input of comparator 720. Internal hysteresis in comparator 720 causes its output IOUT <2.5 A to switch high as the load current at (+) OUT decreases to approximately 2.5 A and low as it increases to approximately 2.75 A. N-channel MOSFET 713, capacitor 714 (1 uF), diode 715, reference voltage 716 (+2.25V) and resistors 717 (2 MegΩ) and 719 (249 kΩ) comprise the circuitry for surge current capability (typically 300 A) of battery supervisors 11 and 211. MOSFET 713 has a very low gate threshold voltage (0.5 to 1V). Voltage divider resistors 717 and 719 bias node 718 to +0.25V, to lower the effective threshold voltage. Therefore, a small, sudden voltage increase at node 616 (typically 500 mV) will initiate full surge current capability (typically 300 A). With a sudden load current increase at (+) OUT, MOSFET 713 will turn on and stay on until the voltage at node 718 drops below the threshold voltage of MOSFET 713. The step voltage increase at IFB node 616, capacitor 714 and the parallel resistance of resistors 717 and 719 determine the on time of the surge current capability (typically 250 mS for full surge current, decreasing to no surge current in approximately 850 mS). Diode 715 protects the gate of MOSFET 713 from an over-voltage condition during reverse battery and it also provides rapid discharge of capacitor 714, to allow repetitive current surges.

Figure 5A:
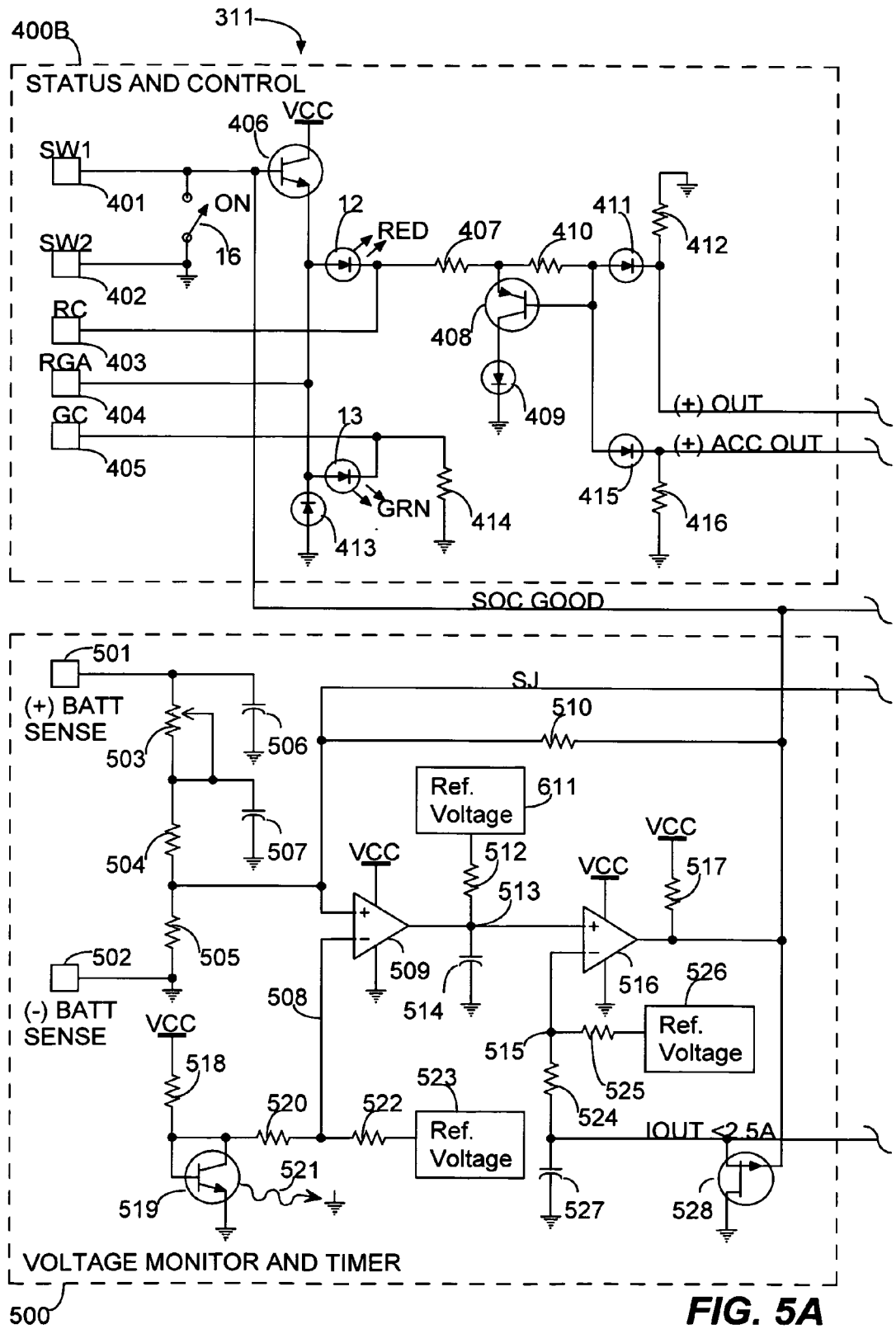
FIGS. 5A, 5B and 5C combine to form a schematic diagram of a dual-output version of the on-board battery supervisor of FIG. 3 in accordance with the present invention.
Figure 5B:
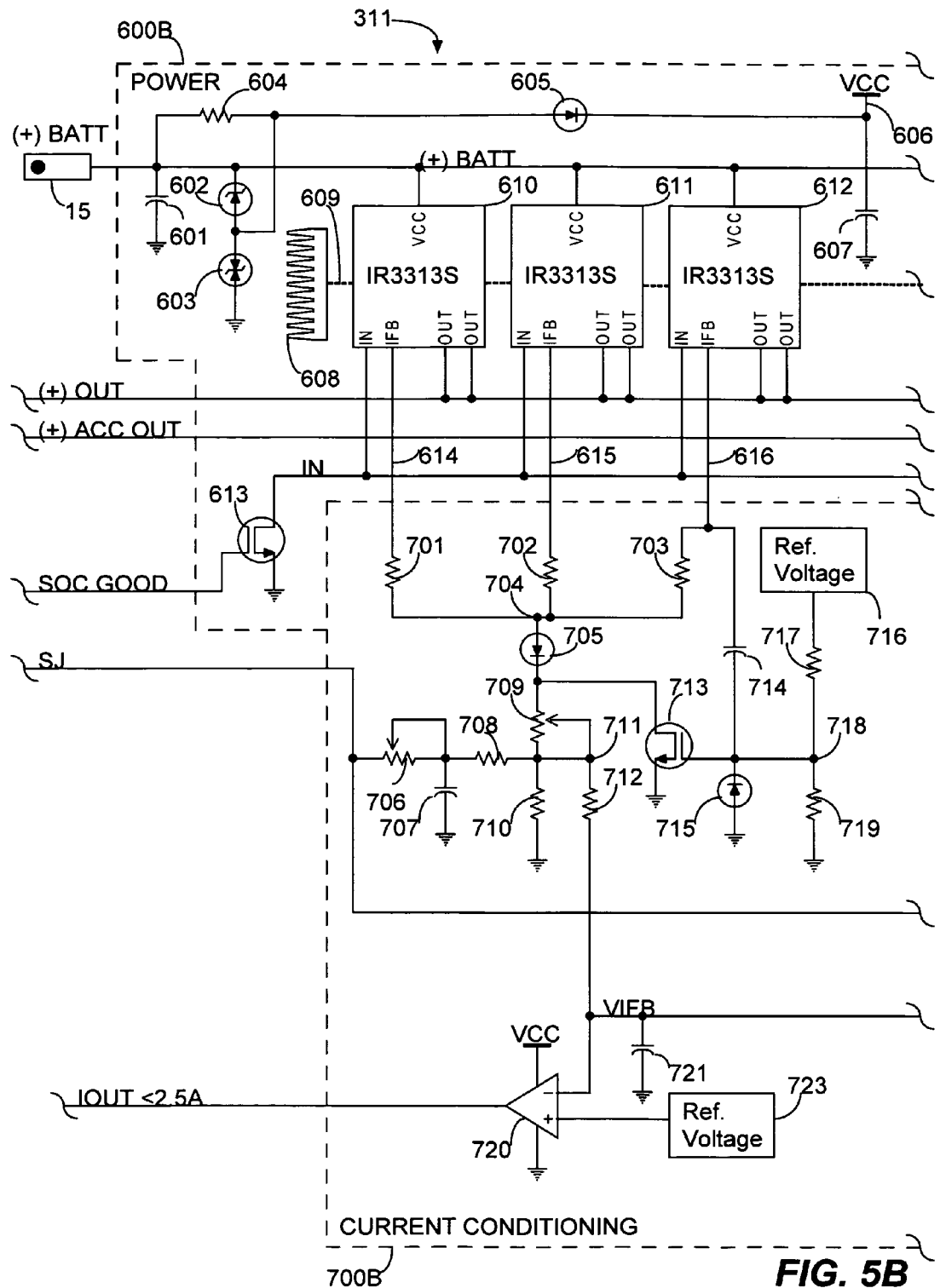
Figure 5C:
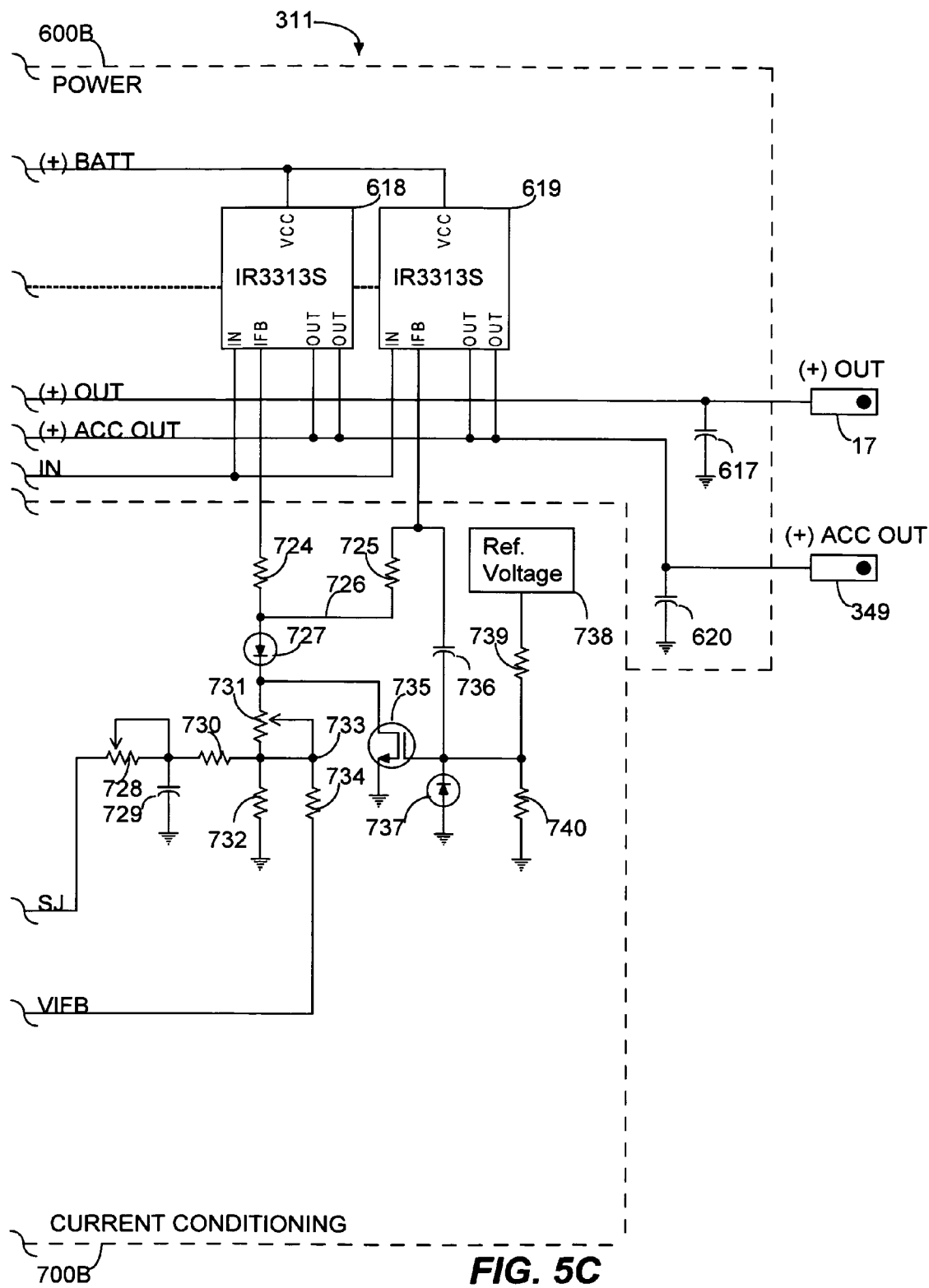

FIGS. 5A, 5B and 5C combine to form a schematic diagram of the circuitry contained in battery supervisor 311 in FIG. 3. FIGS. 5A, 5B and 5C are an embodiment of a dual-output version of the present invention. For this discussion also refer to FIG. 3. In operation, the description of FIGS. 5A, 5B and 5C are the same as the description of FIGS. 4A and 4B, with the following exceptions. The addition of a second circuit breaker/switch output (+) ACC OUT on bus bar 349 requires additional circuitry. Additional circuitry is required in STATUS AND CONTROL box 400A, in FIG. 4A, POWER section 600A, in FIG. 4B and CURRENT CONDITIONING box 700A, in FIG. 4B, and is clarified by renaming these boxes 400B, 600B and 700B, respectively, in FIGS. 5A, 5B and 5C. In STATUS AND CONTROL box 400B, diode 415 blocks reverse current through red LED 12 and along with pull down resistor 416 (33.2 kΩ) detects when added circuit breaker/switches 618 and 619, in FIG. 5C, are off (i.e. a fault exists). VOLTAGE AND MONITOR box 500, in FIG. 5A, has no component changes, but variable resistor 503 (115 kΩ typical setting) is set to a slightly lower value because of additional current from summing junction SJ to resistor 728 in CURRENT CONDITIONING box 700B, in FIG. 5C. In POWER box 600B, in FIG. 5C, two more intelligent, high side switches 618 and 619 provide the additional circuit breaker/switch function of output (+) ACC OUT on bus bar 349. They provide the same features and functionality as circuit breaker/switches 610, 611 and 612 in FIGS. 4B and 5B. Capacitor 620 (0.1 uF) provides ESD protection and transient voltage filtering. Additional circuitry in CURRENT CONDITIONING box 700B, in FIG. 5C, performs the same functions as similar circuitry in CURRENT CONDITIONING box 700A, in FIG. 4B. Some component values have been changed on similar components because the current rating for output (+) ACC OUT is 30 A, instead of the 60 A rating for output (+) OUT. Variable resistor 728 (497 kΩ typical setting for 23 mΩ battery internal resistance of battery 19), variable resistor 731 (436Ω typical setting for 33 A trip level), sense resistor 732 (499Ω), and resistor 734 (100 kΩ) have new values. An additional feedback path is required from node 733 to summing junction SJ in VOLTAGE MONITOR AND TIMER box 500 in FIG. 5A. This additional feedback path, through resistors 728 and 730, is required because the average current ratio (typically 8800) of output load current at (+) OUT ACC to feedback current IFB at node 726 will be different from the average current ratio for the load current at (+) OUT. And therefore, also requires its own adjustment, via variable resistor 728. Resistor 734 (100 kΩ), in FIG. 5C, is "weighted" with resistor 712 (41.2 kΩ), in FIG. 5B. This allows output IOUT <2.5 A of comparator 720, in FIG. 5B, to switch high as the total output load current from outputs (+) OUT and (+) ACC OUT decreases to approximately 2.5 A, regardless of the level of load current from each output. Being "Weighted" requires the ratio of resistor 712 (41.2 k) to resistor 734 (100 kΩ) to be equal to the ratio of resistor 710 (205Ω), in FIG. 5B, to resistor 732 (499Ω), in FIG. 5C. The amplitude of the voltage at signal VIFB, in FIG. 5B, is lower than it is in FIG. 4B. The reason for this is the voltage divider formed by resistors 712 and 734. Therefore, the reference voltage 722 (+61 mV) for comparator 720, in FIG. 4B, is reduced to +44 mV and is reference voltage 723 (+44 mV), in FIG. 5B. Hysteresis internal to comparator 720, in FIG. 5B, causes output IOUT <2.5V to switch high at approximately 2.5 A and low at approximately 2.85 A. The remaining components, in CURRENT CONDITIONING box 700B, in FIG. 5C, have the same values and function as their counterparts, in CURRENT CONDITIONING box 700A, in FIG. 4B. They are diodes 727 and 737, resistors 724 (316Ω), 725 (316Ω), 730 (33.2 kΩ), 739 (2 MegΩ) and 740 (249 kΩ), capacitor 736 (1 uF) and reference voltage 738 (+2.25V).

Figure 6:
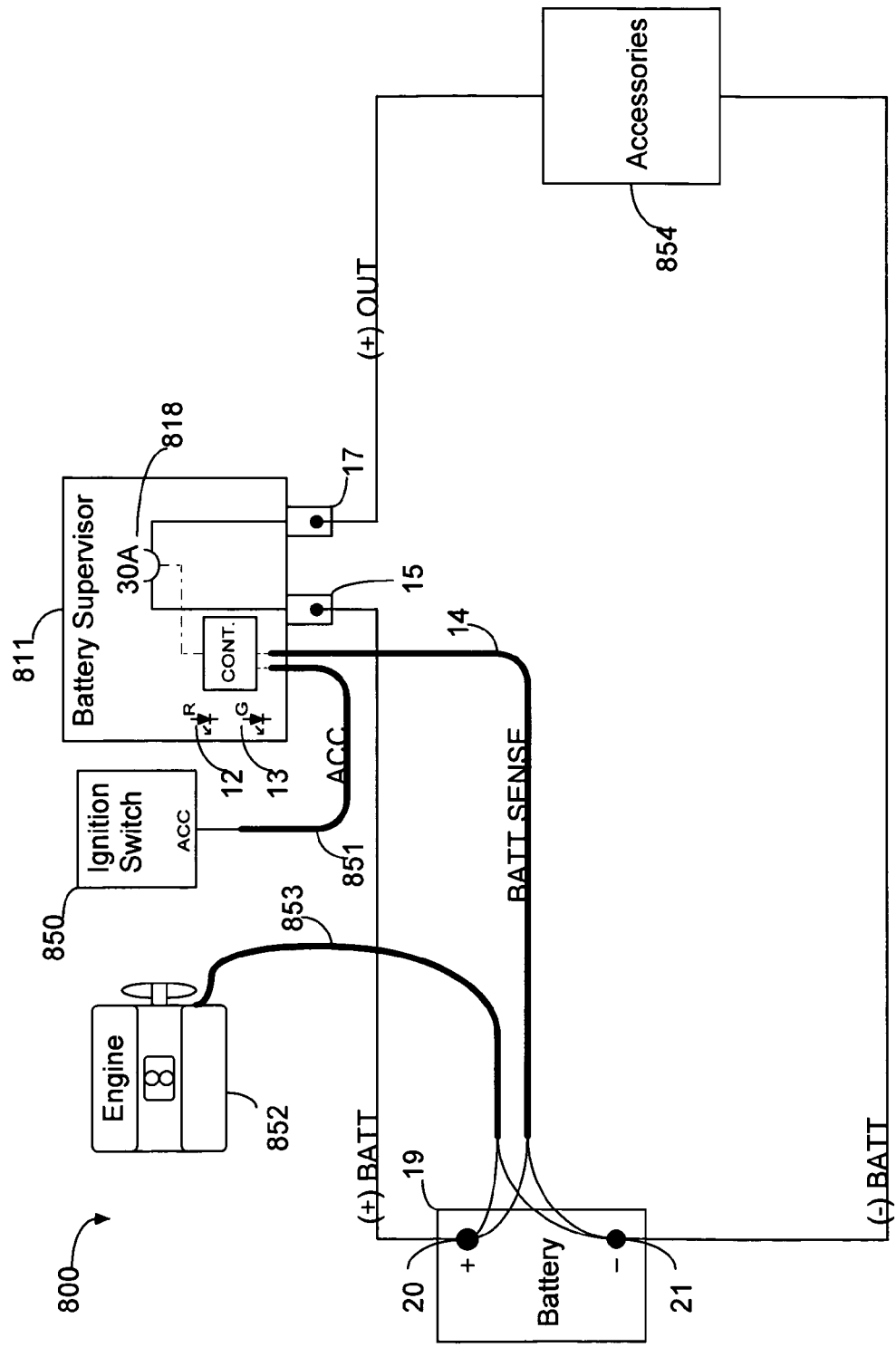
FIG. 6 is a simplified block diagram illustrating a motor vehicle's electrical system in which a single-output, ignition switch version of the on-board battery supervisor of the present invention reside.

FIG. 6 illustrates a typical motor vehicle electrical system 800 that includes a waterproof, single-output, ignition switch version of on-board battery supervisor 811 with a 30 A, circuit breaker/switch 818 in accordance with the present invention. Not all circuitry is shown, only enough to illustrate the present invention. Engine 852 uses battery 19 for "starting" and "charges" battery 19 when it is running. 2-wire cable 853 connects to appropriate positive terminal 20 and negative terminal 21 of battery 19. 1-wire ACC cable 851 is a "hard-wired" cable that connects to the accessory output ACC from ignition switch 850. Accessories 854 could include a variety of loads such as a TV, a stereo radio, a DVD player and a navigation system.

FIG. 6 represents another embodiment of the present invention, where battery supervisor 811 is controlled by the accessory output from the engine's ignition switch 850. Circuit breaker/switch 818 rating is 30 A, but could be from 25 A to 75 A. The electrical system 800 in FIG. 6 is representative of a vehicle where the vehicle engine battery is protected against over-discharging to a level that would make starting the vehicle engine 852 difficult or impossible. This electrical system 800 could include (but is not limited to) boats (including bass boats that have a separate electrical system for the trolling motor), RVs, automobiles and trucks. Operation of the electrical system in FIG. 6 is the same as in FIG. 1 with the following exceptions. Ignition switch 850 controls battery supervisor 811. This application of the invention (battery supervisor 811) provides accessory power only when the ignition switch 850 is in the accessory or on position. When the ignition switch 850 is in the off position, battery supervisor 811 is off and in a low current drain state (i.e. <1 mA). If circuit/breaker switch 818 is tripped from an overload, turning ignition switch 850 off and back on will reset it.

Figure 7:
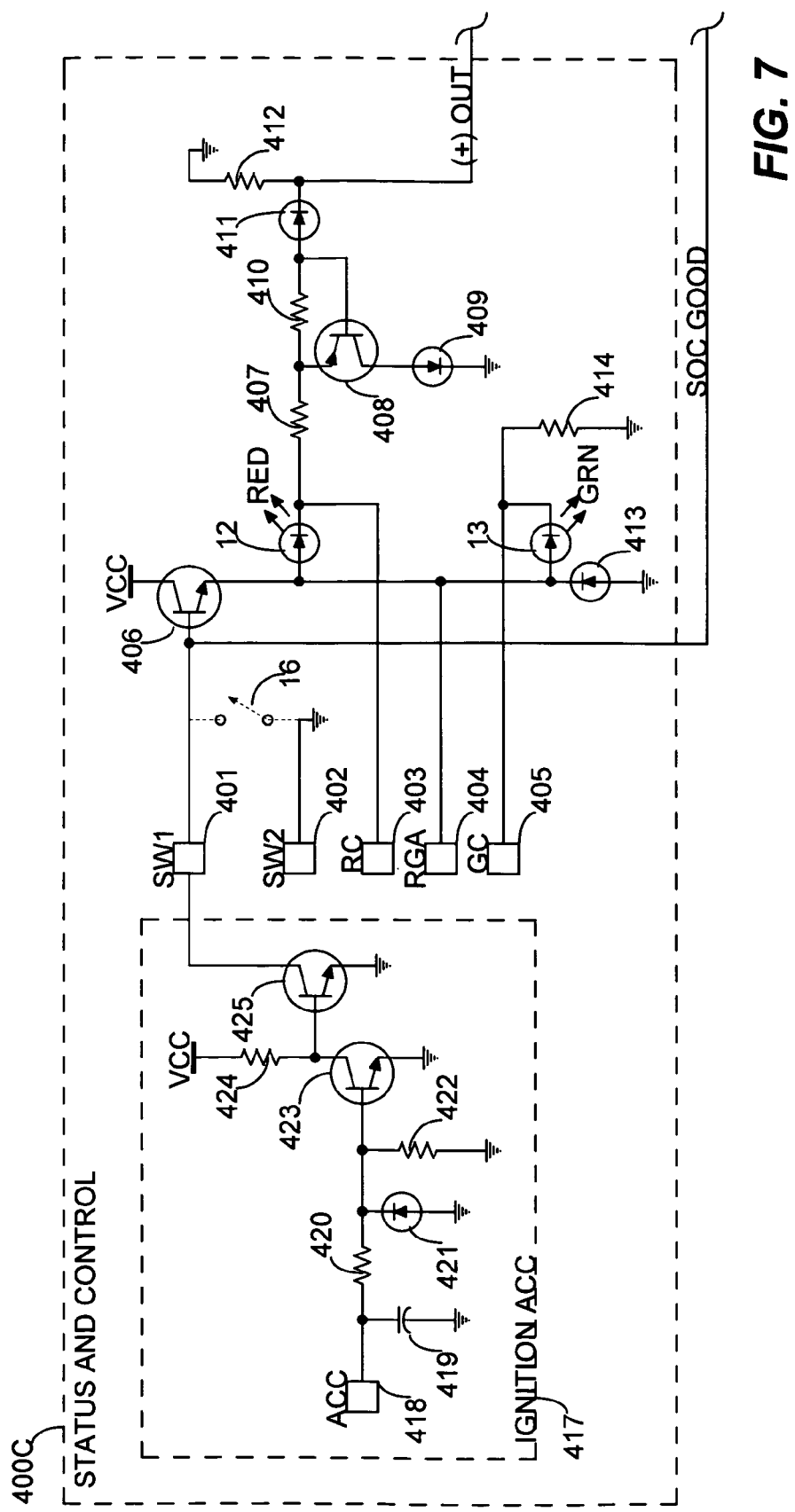
FIG. 7 is a schematic diagram of the STATUS AND CONTROL box 400C of a single-output, ignition switch version of the on-board battery supervisor of FIG. 6 in accordance with the present invention.

FIG. 7 is a schematic diagram of the circuitry contained in STATUS AND CONTROL box 400C (part of battery supervisor 811 in FIG. 6). The remainder of the schematic diagram for battery supervisor 811 is the same as the schematic diagram in FIGS. 4A and 4B, with the exception of the value of resistor 709 (783Ω typical setting for 33 A trip level) in CURRENT CONDITIONING box 700A, in FIG. 4B. For this discussion also refer to FIG. 6. The description of FIG. 7 is the same as the description of STATUS AND CONTROL box 400A, in FIG. 4A, with the following exceptions. Since the battery supervisor 811 is controlled by the accessory signal ACC on cable 851 from the ignition switch 850, there is no need for OFF/RESET-ON switch 16 (shown dashed where it normally resides). The ACC signal is typically +12.6V when ignition switch 850 is in the accessory position and typically +13.8V when ignition switch 850 is in the on position and vehicle engine 852 is running. Additional circuitry shown in IGNITION ACC box 417, is part of the same PCB assembly, but the components are loaded only in the ignition switch version of the invention, battery supervisor 811. ACC solder pad 418 is the control input and is the connection point for the 1-wire ACC accessory cable 851. Capacitor 419 (0.1 uF) provides ESD protection and resistor 420 (33.2 kΩ) limits the input current. Diode 421 provides reverse voltage protection for the base-emitter junction of NPN transistor 423. Resistor 422 (33.2 kΩ) ensures transistor 423 remains off when there is no current path to ground at the ACC input. Pull-up resistor 424 (249 kΩ) keeps NPN transistor 425 on and battery supervisor 811 off when ACC is low and transistor 423 is off. When ACC is high, transistor 425 is off and battery supervisor 811 is on. The remote status feature is still viable (i.e. a 3-wire cable can be wired to solder pads 403, 404 and 405 and external LEDs can be used. LEDs 12 and 13 would not be loaded on the PCB. Some applications may not require (and not prefer) status indicators. Then LEDs 12 and 13 would not be loaded.

Although several specific embodiments of the invention have been described and illustrated, the invention is not to be limited to the specific forms or arrangements so described and illustrated. For example, more or fewer high side switches may be used in parallel to increase or decrease the output current capability and different current ratings can be chosen for the circuit breaker/switches.

What is claimed is:

1. An on-board battery supervisor means for monitoring the state-of-charge (SOC) of a battery in a boat having an outboard motor (or other engine type), the on-board battery supervisor means comprising:
    a voltage means for measuring the voltage of the battery through Kelvin connections;
    a dual timer means for determining when the output of the voltage means is valid;
    a current sensing means for measuring load current from the battery, excluding outboard motor current;
    a compensation means for battery internal resistance;
    an evaluation means for determining the state-of-charge (SOC) of the battery based on the relationship between the measured voltage, measured current, battery internal resistance compensation and the dual timer;
    a first switching moans for connecting and disconnecting loads connected to the battery;
    a latching, adjustable, circuit breaker means that is integral to the first switching means;
    a second switching means for manual control of first switching means and for resetting the latching, adjustable, circuit breaker means;
    a first status means for indicating when the state-of-charge (SOC) level of the battery is above a level that allows for reliably starting the outboard motor; and
    a second status means for indicating a fault.

2. The apparatus of claim 1, wherein the said dual timer means is a 1-minute timer for load currents above approximately 2.75 A and a 10-minute timer for load currents below approximately 2.5 A.

3. The apparatus of claim 1, wherein the said compensation means for battery internal resistance is based on the load current measured by said current sensing means and the marine cranking amp (MCA) rating of the battery e.g. a battery with an MCA rating of 875 A has a typical Internal resistance of 23 mΩ when delivering 40A of current.

4. The apparatus of claim 1, wherein the said evaluation means switches the said first switching means off at a decreasing level of the state-of-charge (SOC) of the battery (typically 20%), leaving enough energy in the battery to reliably start the outboard motor (or other engine type).

5. The apparatus of claim 1, wherein the said evaluation means switches the said first switching means on (after being off) as the level of the state-of-charge (SOC) of the battery increases (as a result of being charged) to approximately 30%.

6. The apparatus of claim 1, wherein the on-board battery supervisor means has a low quiescent current, <1 mA when off and typically 12 mA when on.

7. The apparatus of claim 1, wherein the on-board battery supervisor means allows an operator to confidently use the same battery for starting the outboard motor (which replaces charge In the battery each time the outboard motor is running) and for powering the trolling motor and other accessories.

8. An on-board dual output battery supervisor meane for monitoring the state-of-charge (SOC) of a battery in a boat having an outboard motor (or other engine type), the on-board dual output battery supervisor means comprising:
    a voltage means for measuring the voltage of the battery through Kelvin connections:
    a dual timer means for determining when the output of the voltage means is valid;
    a current sensing means for measuring load current from the battery, excluding outboard motor current;
    a compensation means for battery internal resistance;
    an evaluation means for determining the state-of-charge (SOC) of the battery based on the relationship between the measured voltage, measured current, battery internal resistance compensation and the dual timer;
    a first switching means for connecting and disconnecting a trolling motor connected to the battery;
    a second switching means for connecting and disconnecting other accessory loads to the battery;
    a latching, adjustable, circuit breaker means that is integral to the first switching means and to the second switching means;
    a third switching means for manual control of first and second switching means and for resetting the latching, adjustable, circuit breaker means;
    a first status means for indicating when the state-of-charge (SOC) level of the battery is above a level that allows for reliably starting the outboard motor; and
    a second status means for indicating a fault.

9. The apparatus of claim 8, wherein the said dual timer means is a 1-minute timer for load currents above approximately 2.85 A and a 10-minute timer for load currents below approximately 2.5 A.

10. The apparatus of claim 8, wherein the said compensation means for battery internal resistance is based on the load current measured by said current sensing means and the marine cranking amp (MCA) rating of the battery e.g. a battery with an MCA rating of 875 A has a typical internal resistance of 23 mΩ when delivering 40 A of current.

11. The apparatus of claim 8, wherein the said evaluation means switches the said first switching means off at a decreasing level of the state-of-charge (SOC) of the battery (typically 20%), leaving enough energy In the battery to reliably start the outboard motor (or other engine type).

12. The apparatus of claim 8, wherein the said evaluation means switches the said first switching means on (after being off) as the level of the state-of-charge (SOC) of the battery increases (as a result of being charged) to approximately 30%.

13. The apparatus of claim 8, wherein the on-board battery supervisor means has a low quiescent current, <1 mA when off and typically 18 mA when on.

14. The apparatus of claim 8, wherein the on-board battery supervisor means allows an operator to confidently use the same battery for starting the outboard motor (which replaces charge in the battery each time the outboard motor is running) and for powering the trolling motor and other accessories.

15. An on-board battery supervisor means for monitoring the state-of-charge (SOC) of a battery In a motor vehicle, the on-board battery supervisor means comprising:
- a voltage means for measuring the voltage of the battery through Kelvin connections;
- a dual timer means for determining when the output of the voltage means is valid;
- a current sensing means for measuring load current from the battery, excluding outboard motor current
- a compensation means for battery Internal resistance;
- an evaluation means for determining the state-of-charge (SOC) of the battery based on the relationship between the measured voltage, measured current, battery internal resistance compensation and the dual timer;
- a first switching means for connecting and disconnecting loads connected to the battery;
- a latching, adjustable, circuit breaker means that is integral to the first switching means;
- a control means using the accessory output from the vehicle ignition key to enable the on-board battery supervisor to be on and to keep it off (and also reset the latching, adjustable, circuit breaker means in the event it becomes tripped) when the vehicle ignition key is off.

16. The apparatus of claim 15, wherein the on-board battery supervisor means has a low quiescent current, <1 mA, when the ignition switch is off and typically 12 mA when the ignition switch is on.

* * * * *